United States Patent
Aoyagi et al.

(10) Patent No.: US 8,540,135 B2
(45) Date of Patent: Sep. 24, 2013

(54) BONDING METHOD, BONDING APPARATUS, AND MANUFACTURING METHOD OF SEMICONDUCTOR DEVICE USING THE SAME

(75) Inventors: Nobuyuki Aoyagi, Tokyo (JP); Hiroaki Yoshino, Tokyo (JP)

(73) Assignee: Shinkawa Ltd., Tokyo (JP)

( * ) Notice: Subject to any disclaimer, the term of this patent is extended or adjusted under 35 U.S.C. 154(b) by 0 days.

(21) Appl. No.: 13/044,834

(22) Filed: Mar. 10, 2011

(65) Prior Publication Data

US 2011/0226838 A1   Sep. 22, 2011

Related U.S. Application Data

(63) Continuation of application No. PCT/JP2009/058393, filed on Apr. 28, 2009.

(30) Foreign Application Priority Data

Sep. 10, 2008 (JP) .................................. 2008-232444

(51) Int. Cl.
*B23K 20/00* (2006.01)
*B23K 20/10* (2006.01)
*B23K 31/02* (2006.01)

(52) U.S. Cl.
USPC ...... 228/180.5; 228/4.5; 228/904; 228/110.1; 228/1.1; 228/111

(58) Field of Classification Search
USPC .................... 228/1.1, 110.1, 180.5, 4.5, 904
See application file for complete search history.

(56) References Cited

U.S. PATENT DOCUMENTS

| 6,119,917 A * | 9/2000 | Takahashi et al. ............ 228/102 |
| 7,735,707 B2 | 6/2010 | Seyama |
| 2008/0011809 A1 | 1/2008 | Seyama |

FOREIGN PATENT DOCUMENTS

| JP | 2005-167054 | 6/2005 |
| JP | 2005235846 | 9/2005 |
| JP | 2006-32875 | 2/2006 |
| JP | 2006-303168 | 11/2006 |
| JP | 2008-21839 | 1/2008 |

OTHER PUBLICATIONS

International Search Report dated Jun. 16, 2009, from the corresponding International Application.

* cited by examiner

*Primary Examiner* — Keith Walker
*Assistant Examiner* — Erin Saad
(74) *Attorney, Agent, or Firm* — Katten Muchin Rosenman LLP

(57) ABSTRACT

Provided is a bonding apparatus capable of forming even loops at high speed. According to a bonding apparatus 1, a capillary 5 is lowered to a bonding position to bond an initial ball 10 to a pad 104 on an overhanging die 100. Here, a position of the capillary 5 in a Z direction and a load detected by a load sensor 7 are detected and stored every predetermined time period. A load change point is detected by referring to the stored load and the stored position. By subtracting the bonding position from a load changing position of the capillary 5 at the load change point, a movement amount Z of the capillary 5 from the load changing position to the bonding position is calculated. After the capillary 5 is lifted by the movement amount Z, a wire loop is formed between the pad 104 and a lead 105.

3 Claims, 6 Drawing Sheets

BONDING METHOD, BONDING APPARATUS, AND MANUFACTURING METHOD OF SEMICONDUCTOR DEVICE USING THE SAME

TECHNICAL FIELD

The present invention relates to a bonding method and a bonding apparatus capable of bonding a wire inserted through a capillary to a pad provided on a free end of an overhanging die, and a manufacturing method of a semiconductor device using the same.

BACKGROUND ART

A wire-bonding apparatus typically includes a swingably provided bonding arm to which a capillary for feeding a wire such as a thin metal wire is attached, and is capable of bonding the wire to a pad of a semiconductor die by causing the bonding arm to swing to press the capillary against the pad of the semiconductor die.

In recent years, overhanging dies that protrude from a lower stack of semiconductor dies and spacers have become used as one form of die stacking. However, as an end portion of such an overhanging die is a free end and not supported by a semiconductor die or a spacer of a lower stack, bonding a wire to a pad disposed on this free end causes the overhanging die to bend by being pressed by a capillary. Therefore, in a case in which wire loops are formed after bonding, reference positions of the wire loops cannot be stabilized, and the height of the wire loops adversely becomes uneven.

Thus, Patent Literatures 1 and 2 take advantage of the fact that when a low load is applied to a bonding arm to move the bonding arm down, the bonding arm stops moving down at a position at which a capillary is brought into contact with an overhanging die, and detect the position at which the capillary is brought into contact with the overhanging die. Then, after bonding the wire, the capillary is moved up to the contact position and a wire loop is formed.

CITATION LIST

Patent Literature

Patent Literature 1: Japanese Patent No. 4068049
Patent Literature 2: Japanese Unexamined Patent Application Publication No. 2006-032875

SUMMARY OF THE INVENTION

Problems to be Solved by the Invention

However, according to the technique disclosed in Patent Literatures 1 and 2, it is required to stop the movement of the capillary at the contact position in order to detect that the capillary is brought into contact with the overhanging die, and this poses a problem that it takes time for forming a loop. In addition, the technique disclosed in Patent Literatures 1 and 2 poses another problem that as it is required to detect the low load in order to detect the contact, such as an error in load variation due to a disturbance lowers accuracy in the detection.

Thus, an object of the present invention is to provide a bonding method and a bonding apparatus capable of forming even loops at high speed, as well as a manufacturing method of a semiconductor device using the same.

Means for Solving the Problems

A bonding method according to the present invention is a bonding method of bonding a wire inserted through a capillary to a pad disposed on a free end of an overhanging die, the method provided with: a first moving step of moving the capillary to a predetermined bonding position; a load change detecting step of, when moving the capillary, detecting a position of the capillary and a load acting on the capillary in association with each other; a bonding step of bonding the wire to the pad at the bonding position; a movement distance calculating step of calculating a movement distance of the capillary by obtaining a load change point based on the position of the capillary and the load acting on the capillary that have been detected in the load change detecting step, and by calculating a difference between a position of the capillary at the load change point and the bonding position, the load change point being a point at which the load acting on the capillary changes; a second moving step of retracting the capillary after bonding the wire to the pad, by the movement distance; and a loop forming step of forming a wire loop by moving the capillary along a predetermined trajectory after the second moving step.

According to the bonding method of the present invention, when moving the capillary to the bonding position, the position of the capillary and the load acting on the capillary are detected. Then, as the load acting on the capillary changes when the capillary is brought into contact with the overhanging die, the movement distance of the capillary from the capillary is brought into contact with the overhanging die until the capillary reaches the bonding position can be calculated by detecting the load change point, and by calculating the difference between the positions of the capillary at the load change point and the bonding position. Further, by retracting the capillary by the movement distance to form the wire loop after bonding the wire to the pad, it is possible to make reference positions of starting points for forming wire loops even. Therefore, the capillary is not required to stop moving when the capillary is brought into contact with the overhanging die, and it is possible to form even loops at high speed.

In this case, it is preferable that the load change point is a point that is closest to the bonding position and at which the load acting on the capillary changes. As the load acting on the capillary changes also by vibration of the capillary and the like before the capillary is brought into contact with the overhanging die, it is difficult to determine whether the change in the load is caused by the contact between the capillary and the overhanging die, or by the vibration of the capillary and such. Therefore, according to this bonding method, by taking a point that is closest to the bonding position and at which the load changes as the load change point, it is possible to eliminate an influence of the vibration of the capillary and such that generates before the capillary is brought into contact with the overhanging die. Thus, it is possible to calculate the movement distance Z even more accurately.

A bonding apparatus according to the present invention is a bonding apparatus for carrying out bonding to a pad disposed on a free end of an overhanging die, the apparatus provided with: a capillary having a wire inserted therethrough; an ultrasonic vibrator configured to apply ultrasonic wave to a bonding target through the capillary; an ultrasonic horn holding the capillary at one end and having the ultrasonic vibrator at the other end, and configured to transmit the ultrasonic wave to the capillary; a load detector configured to detect a load acting on the capillary; bonding control means for moving the capillary to a predetermined bonding position to bond the wire to the pad, and forming a wire loop by moving the capillary along a predetermined trajectory; and load change detecting means for, when moving the capillary, detecting a position of the capillary and the load acting on the capillary that has been detected by the load detector in association with each other, wherein the bonding control means forms the wire loop by obtaining a load change point based on the position of the capillary and the load acting on the capillary that have been detected by the load change detecting means, calculating a movement distance of the capillary by calculating a difference between a position of the capillary at the load change point and the bonding position, retracting the capillary by the movement distance, and moving the capillary along the predetermined trajectory, the load change point being a point at which the load acting on the capillary changes.

According to the bonding apparatus of the present invention, when moving the capillary to the bonding position, the position of the capillary and the load acting on the capillary are detected. Then, as the load acting on the capillary changes when the capillary is brought into contact with the overhanging die, the movement distance of the capillary from the capillary is brought into contact with the overhanging die until the capillary reaches the bonding position can be calculated by detecting the load change point, and by calculating the difference between the positions of the capillary at the load change point and the bonding position. Further, by retracting the capillary by the movement distance to form the wire loop after bonding the wire to the pad, it is possible to make the reference positions of the starting points for forming wire loops even. Therefore, the capillary is not required to stop moving when the capillary is brought into contact with the overhanging die, and it is possible to form even loops at high speed.

Further, it is preferable that there is further provided a bonding arm swingably provided and configured to hold the ultrasonic horn, wherein the bonding arm includes: an arm base-end portion provided with a drive unit for swinging the bonding arm; an arm tip-end portion disposed on a tip-end side of the arm base-end portion and configured to hold the ultrasonic horn; and a connecting portion having flexibility and configured to connect the arm base-end portion and the arm tip-end portion, and wherein the load detector is disposed between the arm tip-end portion and the arm base-end portion. According to this bonding apparatus, the arm base-end portion and the arm tip-end portion of the bonding arm are connected by the connecting portion having flexibility. Accordingly, the arm tip-end portion flexes with respect to the arm base-end portion when the load acts on the capillary. Then, as the load detecting means is disposed between the arm base-end portion and the arm tip-end portion, it is possible to appropriately detect the load acting on the capillary, based on the flexure of the arm tip-end portion with respect to the arm base-end portion.

A manufacturing method according to the present invention is a manufacturing method of a semiconductor device by performing bonding operation to a pad disposed on a free end of an overhanging die, the method provided with: a step of providing a semiconductor device that includes: a capillary having a wire inserted therethrough; an ultrasonic vibrator configured to apply ultrasonic wave to a bonding target through the capillary; an ultrasonic horn holding the capillary at one end and having the ultrasonic vibrator at the other end, and configured to transmit the ultrasonic wave to the capillary; a bonding arm having an arm base-end portion swingably attached, an arm tip-end portion disposed on a tip-end side of the arm base-end portion and configured to hold the ultrasonic horn, and a connecting portion having flexibility and configured to connect the arm base-end portion and the arm tip-end portion; and a load detector provided between a rotational center of the bonding arm and the arm tip-end portion so as to offset from a central axis of the ultrasonic horn along a longitudinal direction in a direction approaching toward and retracting from the bonding target, and configured to detect a load acting on the capillary; a first moving step of moving the capillary to a predetermined bonding position; a load change detecting step of, when moving the capillary, detecting a position of the capillary and the load acting on the capillary that has been detected by the load detector in association with each other; a bonding step of bonding the wire to the pad at the bonding position; a movement distance calculating step of calculating a movement distance of the capillary by obtaining a load change point based on the position of the capillary and the load acting on the capillary that have been detected in the load change detecting step, and by calculating a difference between a position of the capillary at the load change point and the bonding position, the load change point being a point at which the load acting on the capillary changes; a second moving step of retracting the capillary after bonding the wire to the pad, by the movement distance; and a loop forming step of forming a wire loop by moving the capillary along a predetermined trajectory after the second moving step.

According to the manufacturing method of the present invention, when moving the capillary to the bonding position, the position of the capillary and the load acting on the capillary are detected. Then, as the load acting on the capillary changes when the capillary is brought into contact with the overhanging die, the movement distance of the capillary from the capillary is brought into contact with the overhanging die until the capillary reaches the bonding position can be calculated by detecting the load change point, and by calculating the difference between the positions of the capillary at the load change point and the bonding position. Further, by retracting the capillary by the movement distance to form the wire loop after bonding the wire to the pad, it is possible to make the reference positions of the starting points for forming wire loops even. Therefore, the capillary is not required to stop moving when the capillary is brought into contact with the overhanging die, and it is possible to manufacture a semiconductor device on which even loops can be formed at high speed.

In this case, it is preferable that the load change point is a point that is closest to the bonding position and at which the load acting on the capillary changes. As the load acting on the capillary changes also by vibration of the capillary and the like before the capillary is brought into contact with the overhanging die, it is difficult to determine whether the change in the load is caused by the contact between the capillary and the overhanging die, or by the vibration of the capillary and such. Therefore, according to this bonding method, by taking a point that is closest to the bonding position and at which the load changes as the load change point, it is possible to eliminate an influence of the vibration of the capillary and such that generates before the capillary is brought into contact with the overhanging die. Thus, it is possible to calculate the movement distance Z even more accurately.

Advantages of the Invention

According to the present invention, it is possible to form even loops at high speed.

BRIEF DESCRIPTION OF DRAWINGS

FIG. 2(a) is a top view of the bonding arm, and FIG. 2(b) is a bottom view of the bonding arm.

FIG. 6(a) shows the load detected by the load sensor, and FIG. 6(b) shows the load acting on the overhanging die.

EMBODIMENTS FOR CARRYING OUT THE INVENTION

Figure 1:
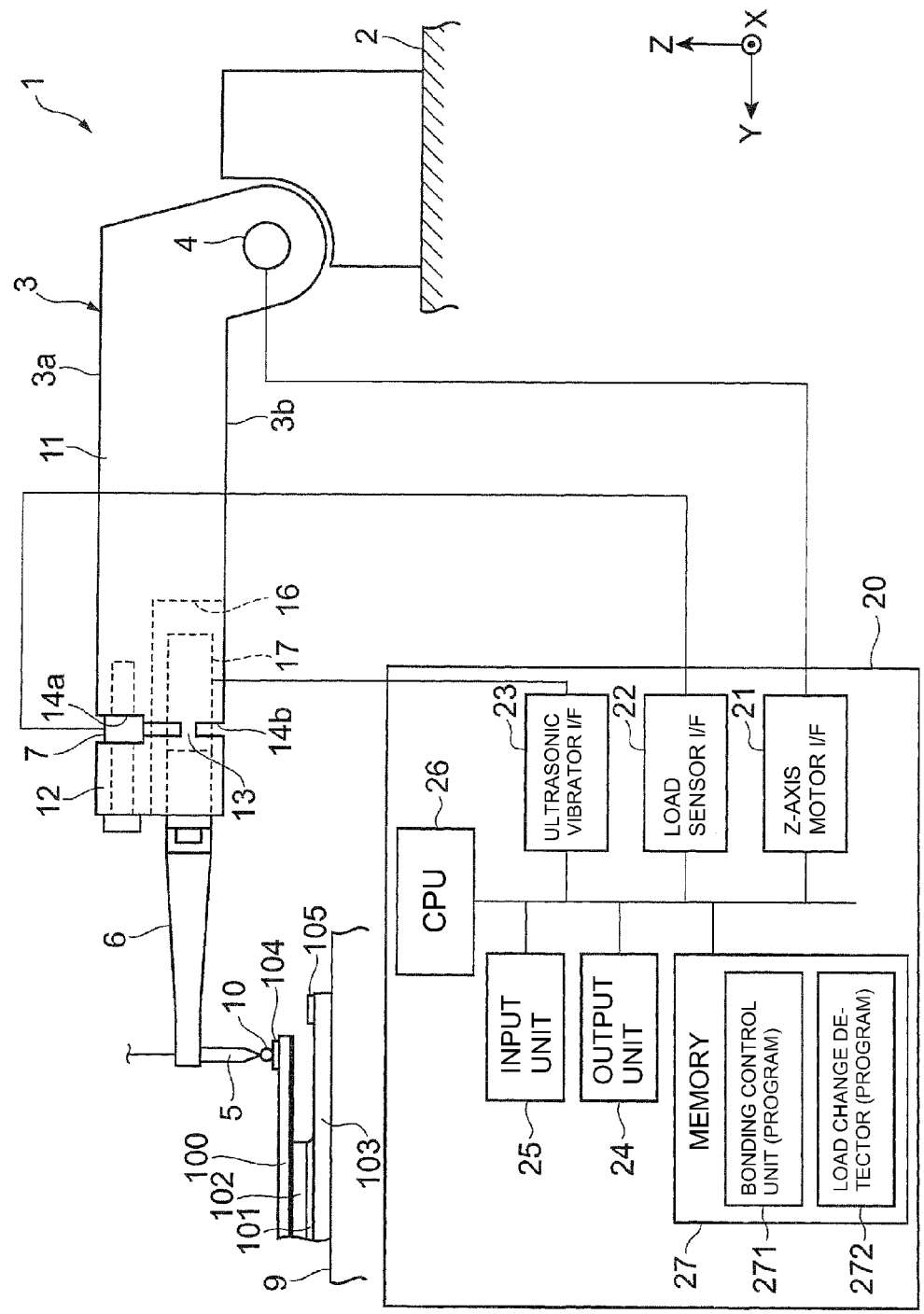
FIG. 1 is a diagram illustrating a bonding apparatus according to an embodiment.

The following describes an exemplary embodiment of a bonding method, a bonding apparatus, and a manufacturing method of a semiconductor device using the same, according to the present invention with reference to the drawings. In the drawings, like or corresponding components are denoted by like reference numerals.

FIG. 1 is a diagram illustrating a bonding apparatus according to the embodiment, and FIG. 2(a) and FIG. 2(b) are partial enlarged views illustrating a bonding arm of the bonding apparatus; FIG. 2(a) is a top view of the bonding arm, and FIG. 2(b) is a bottom view of the bonding arm.

Referring to FIG. 1, an overhanging die 100 subjected to bonding by a bonding apparatus 1 is fixedly attached to a substrate 103 with a lower die 101 and a spacer 102 interposed therebetween, and an end of the overhanging die 100 constitutes a free end that protrudes from the lower die 101. As the spacer 102, a die attachment film tape is used, for example, and the spacer 102 adhesively joins the lower die 101 with the overhanging die 100. Further, a pad 104 as a bonding target is disposed on the free end of the overhanging die 100, and a wire loop is formed between the pad 104 and a lead 105 disposed on the substrate 103.

Figure 2:
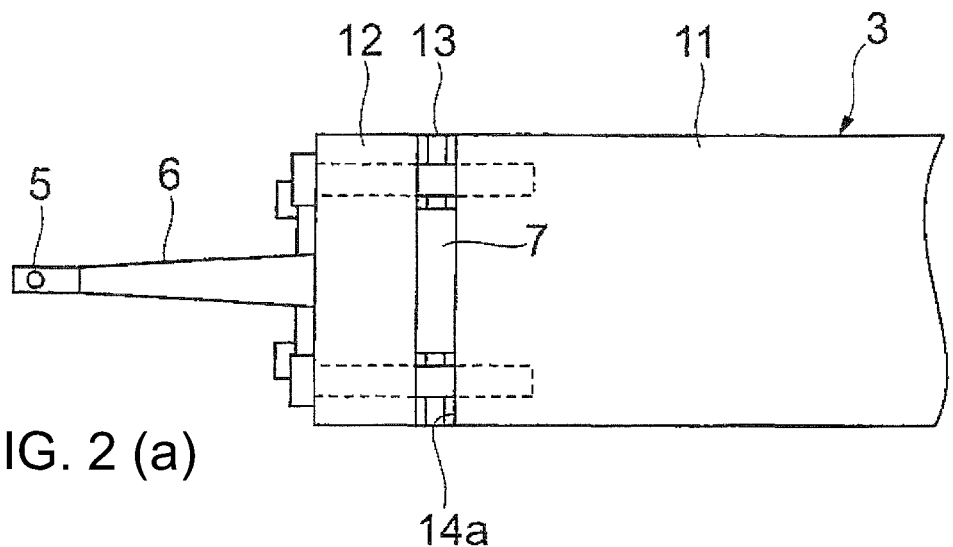
FIG. 2(a) and FIG. 2(b) are partial enlarged views illustrating a bonding arm of the bonding apparatus.
Figure 2:
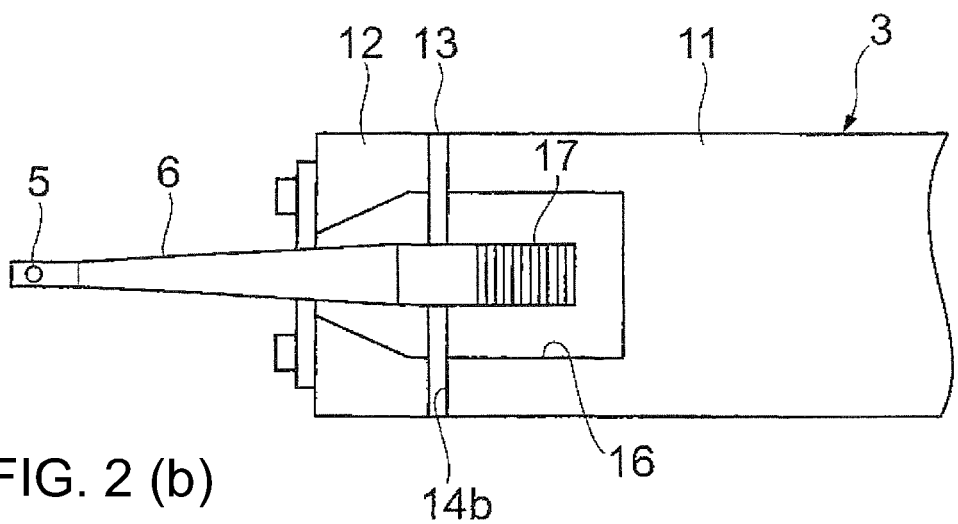

As shown in FIG. 1 and FIG. 2, the bonding apparatus 1 according to this embodiment basically has the same structure as the bonding apparatus disclosed in Japanese Patent Application No. 2008-169797 previously filed by the Applicant of the present application. The bonding apparatus 1 is a wire-bonding apparatus that bonds an initial ball 10, which is a tip end of a wire formed into a ball shape, to the pad 104 disposed on the free end of the overhanging die 100, and forms a wire loop between the pad 104 and the lead 105. Therefore, the bonding apparatus 1 is provided with a bonding head 2 movable in an X-Y direction, a bonding arm 3 swingably attached to the bonding head 2, a drive motor 4 configured to cause the bonding arm 3 to swing with respect to the bonding head 2, a capillary 5 configured to feed and bond a wire inserted therethrough, an ultrasonic horn 6 configured to hold the capillary 5 and generates ultrasonic vibration, a load sensor 7 configured to detect a load acting on the capillary 5, a control unit 20 configured to control the bonding apparatus 1 as a whole, and a bonding stage 9 configured to suction and hold the substrate 103 on which the overhanging die 100 as a bonding target is stacked.

The bonding arm 3 is configured substantially as a rectangular parallelopiped that extends from the bonding head 2 to the bonding stage 9. The bonding arm 3 is provided with an arm base-end section 11 attached to the bonding head 2, an arm tip-end section 12 disposed on a tip-end side of the arm base-end section 11 and to which the ultrasonic horn 6 is attached, and a connecting section 13 having flexibility and that connects the arm base-end section 11 and the arm tip-end section 12. The connecting section 13 is formed in a thin-plated shape, in which a slit (cut-out) 14a of a predetermined depth from a top surface (which is a top surface in FIG. 1) 3a of the bonding arm 3, and a slit 14b of a predetermined depth from a bottom surface (which is a bottom surface in FIG. 1) 3b of the bonding arm 3 are provided. As described above, as the bonding arm 3 is locally thinned at the connecting section 13, the arm tip-end section 12 is configured to flex with respect to the arm base-end section 11.

Referring to FIG. 1 and FIG. 2(b), a recessed portion 16 for containing the ultrasonic horn 6 is provided on a side of the bottom surface 3b of the bonding arm 3. Further, the ultrasonic horn 6 is attached to the arm tip-end section 12 in a state in which the ultrasonic horn 6 is contained in the recessed portion 16 of the bonding arm 3. The ultrasonic horn 6 holds the capillary 5 at its tip end portion that protrudes from the recessed portion 16, and includes an ultrasonic vibrator 17 that is attached to a substrate portion not depicted in the drawing and contained in the recessed portion 16, and that is configured to generate ultrasonic vibration. Here, a piezo-electric oscillator is used as the ultrasonic vibrator 17, for example.

Further, referring to FIG. 1 and FIG. 2(a), an upper portion of the slit 14a on a side of the top surface 3a is provided to be wider. In addition, the load sensor 7 is fitted into (and disposed in) the wide upper portion of the slit 14a so as to be sandwiched between the arm base-end section 11 and the arm tip-end section 12. Specifically, the load sensor 7 is provided so as to offset from a central axis of the ultrasonic horn 6 along a longitudinal direction in a direction approaching toward and retracting from the bonding target, and attached between a rotational center of the bonding arm 3 and an attachment surface of the arm tip-end section 12 for attaching the ultrasonic horn 6 (a tip end surface of the arm tip-end section 12 on a side of the capillary 5). Then, as described above, as the ultrasonic horn 6 that holds the capillary 5 is attached to the arm tip-end section 12, the arm tip-end section 12 flexes with respect to the arm base-end section 11 when a load acts on the capillary 5 due to a reactive force of the bent overhanging die 100, and whereby the load sensor 7 is able to detect the load. Here, a piezo-electric load sensor is used as the load sensor 7, for example.

Further, the control unit 20 is connected to the drive motor 4, the ultrasonic horn 6, and the load sensor 7, and causes the initial ball 10 to be bonded to the pad 104 and a wire loop to be formed between the pad 104 and the lead 105 by driving and controlling the bonding head 2, the drive motor 4, and the ultrasonic vibrator 17. Therefore, the control unit 20 is provided with a Z-axis motor I/F 21 configured to transmit and receive information to and from the drive motor 4, a load sensor I/F 22 configured to transmit and receive data to and from the load sensor 7, and an ultrasonic vibrator I/F 23 configured to transmit and receive information to and from the ultrasonic horn 6, an output unit 24 configured as a display apparatus such as a monitor and to display various control information of the control unit 20, an input unit 25 configured as an input apparatus such as a keyboard and to receive various control information from an operator, a CPU 26 configured to perform various controlling operations based on information acquired from the drive motor 4, the ultrasonic horn 6, the load sensor 7, and the input unit 25, and a memory 27. The memory 27 records a bonding control program 271 that functions as a bonding control means in the control unit 20, and a load change detecting program 272 that functions as a load change detecting means in the control unit 20.

The bonding control program 271 is a program for carrying out wire-bonding to the overhanging die 100. Specifically, according to the bonding control program 271, the drive motor 4 is driven and controlled to move the capillary 5 down to a predetermined bonding position, the ultrasonic vibrator 17 is driven and controlled to cause the initial ball 10 to be bonded to the pad 104, the drive motor 4 is driven and controlled to move the capillary upward, and then, the drive motor 4 is driven and controlled while moving the bonding head 2 to form a wire loop between the pad 104 and the lead 105.

The load change detecting program 272 is a program for detecting a position of the capillary 5 in a Z direction and a change in a load acting on the capillary 5. Specifically, according to the load change detecting program 272, the load detected by the load sensor 7 and the position of the capillary 5 in the Z direction (height) are detected every predetermined period of time when the capillary 5 moves down to the bonding position, and the detected load and the detected position of the capillary 5 in the Z direction are stored in association with each other. In this case, as described above, when the load acting on the capillary 5 changes, the load detected by the load sensor 7 also changes.

Further, the CPU 26 reads the bonding control program 271 and the load change detecting program 272 from the memory 27, expands the programs in such as a RAM that is not depicted in the drawing, and controls the bonding and detects a load change by executing the bonding control program 271 and the load change detecting program 272. Specifically, the CPU 26 refers to the load and the Z-axis position of the capillary 5 stored by the execution of the load change detecting program 272 to detect a load change point at which the load acting on the capillary 5 changes, and obtains a load changing position which is a Z-axis position of the capillary 5 at the point of the load change. Then, the CPU 26 executes the bonding control program 271, and by subtracting the bonding position from the load changing position, calculates a movement amount (distance) Z from a point at which the initial ball 10 is brought into contact with the pad 104 till a point at which the capillary 5 reaches the bonding position. Moreover, upon bonding of the initial ball 10 to the pad 104, the capillary 5 is moved upward by the movement amount (distance) Z before forming a wire loop between the pad 104 and the lead 105. Here, the position of the capillary 5 after being moved by the movement amount (distance) Z corresponds to a reference position of a starting point for forming a wire loop.

Figure 3:
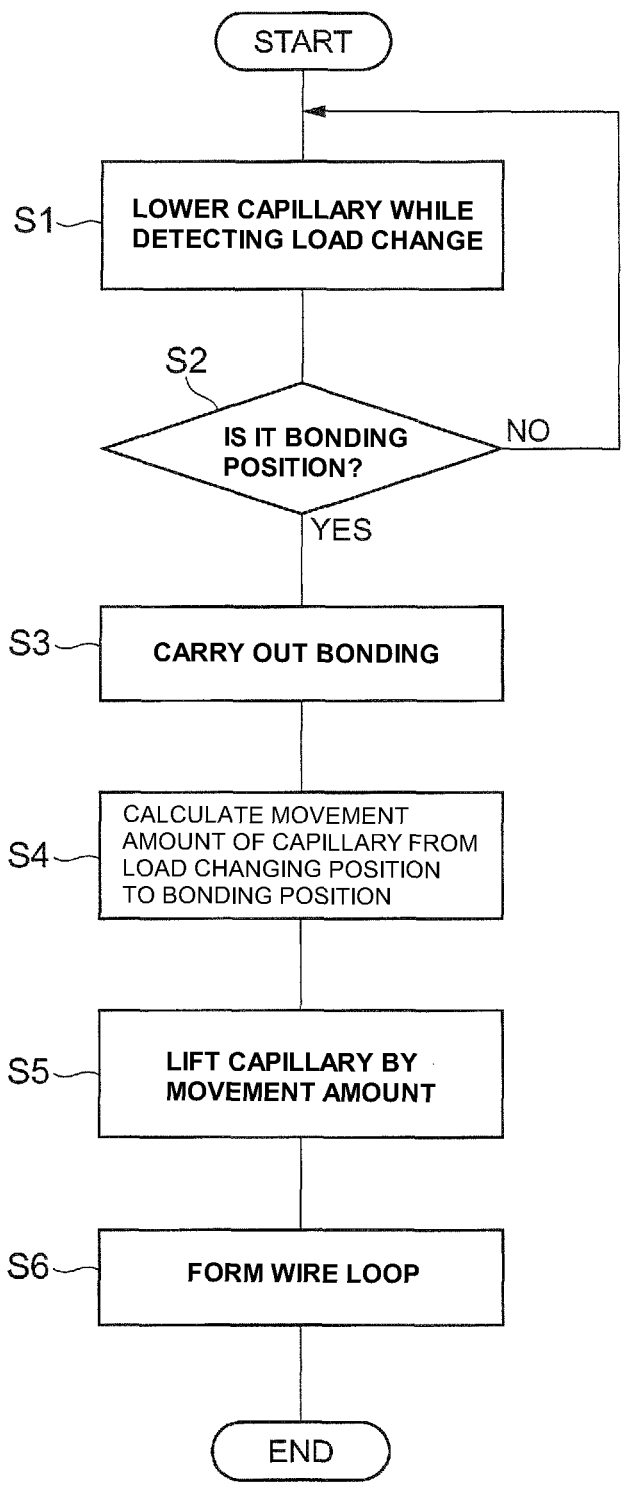
FIG. 3 is a flowchart for explaining a bonding method.
Figure 4:
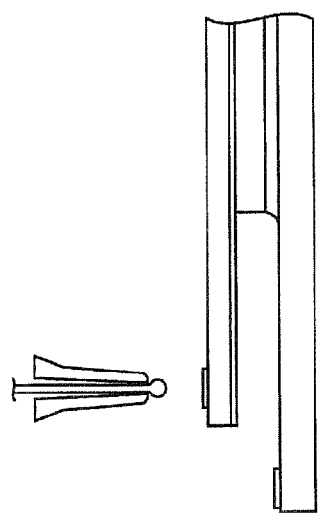
FIG. 4(a) to FIG. 4(f) are views illustrating relations between a capillary and an overhanging die.
Figure 4:
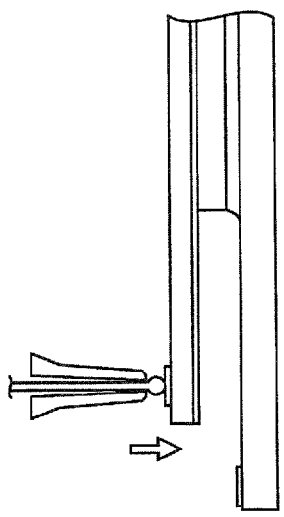
Figure 4:
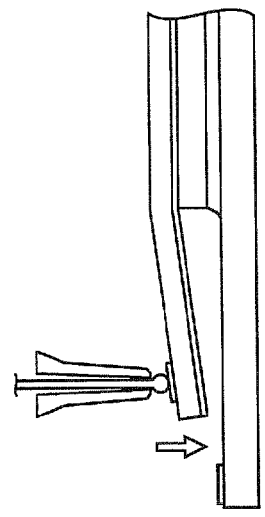
Figure 4:
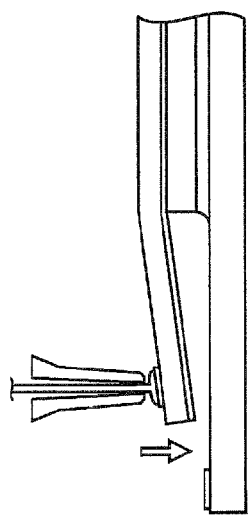
Figure 4:
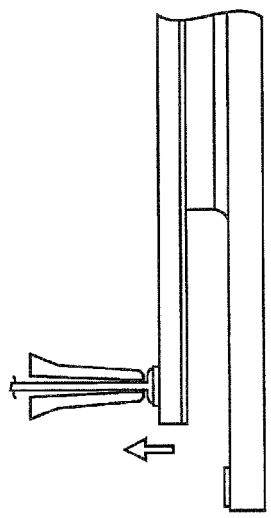
Figure 4:
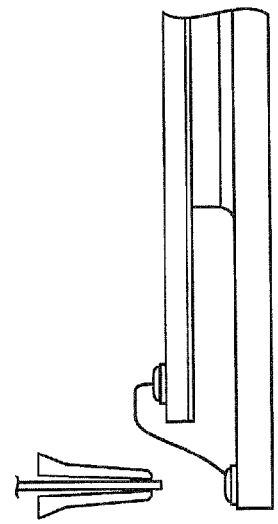

Next, the bonding method of bonding the wire to the overhanging die 100 using the bonding apparatus 1 is described with reference to FIG. 3 to FIG. 6. FIG. 3 is a flowchart for explaining the bonding method, and FIG. 4(*a*) to FIG. 4(*f*) are views illustrating relations between the capillary and the overhanging die. Operations described below are carried out based on the control by the control unit 20.

As shown in FIG. 3, the control unit 20 moves the capillary 5 down while detecting the load acting on the capillary 5 (Step S1). In Step S1, the control unit 20 first forms a tip end of the wire inserted through the capillary 5 into the initial ball 10 of a ball shape using such as an electronic flame off that is not depicted in the drawing (see FIG. 4(*a*)). Thereafter, the control unit 20 controls and drives the drive motor 4, and applies a predetermined load to the bonding arm 3 to cause the bonding arm 3 to swing, and thereby causing the capillary 5 to move down. This brings the initial ball 10 into contact with the pad 104 (see FIG. 4(*b*)). Then, the pad 104 is further pressed against the initial ball 10, and the overhanging die 100 bends downward (see FIG. 4(*c*)). In this case, the predetermined load applied to the bonding arm 3 is a load with which the capillary 5 stops moving down by setting off the reactive force of the overhanging die 100 when the capillary 5 is moved down to the predetermined bonding position while the overhanging die 100 is being bend. Therefore, the capillary 5 stops moving downward when the capillary 5 reaches the bonding position. In addition, while the capillary 5 is moving downward, the control unit 20 detects the position of the capillary 5 in the Z direction (height) every predetermined period of time, as well as the load detected by the load sensor 7. Then, the control unit 20 stores the Z-axis position of the capillary 5 and the load detected by the load sensor 7 in association with each other.

Next, the control unit 20 determines whether or not the capillary 5 has moved down to the bonding position (Step S2). As described above, the capillary 5 stops moving down when the capillary 5 reaches down to the bonding position. Accordingly, the control unit 20 determines that the capillary 5 has reached the bonding position when the capillary 5 stops moving down, and determines that the capillary 5 has not yet reached the bonding position when the capillary 5 keeps moving down.

Then, in Step S2, when it has been determined that the capillary 5 has reached down to the bonding position (Step S2: YES), the control unit 20 bonds the initial ball 10 to the pad 104 of the overhanging die 100 (Step S3). Specifically, by controlling and driving the ultrasonic vibrator 17 to generate ultrasonic vibration, the control unit 20 applies the ultrasonic vibration to the initial ball 10 through the capillary 5. As the initial ball 10 and the pad 104 are pressing against each other at a predetermined pressure, this generates a frictional force between the initial ball 10 and the pad 104, and the pad 104 is joined (bonded) to the initial ball 10 (see FIG. 4(*d*)).

Next, the control unit 20 refers to the Z-axis position of the capillary 5 and the load detected by the load sensor 7 that have been stored in Step S1, and calculates the movement amount (distance) Z of the capillary 5 from the load changing position to the bonding position (Step S4).

Figure 5:
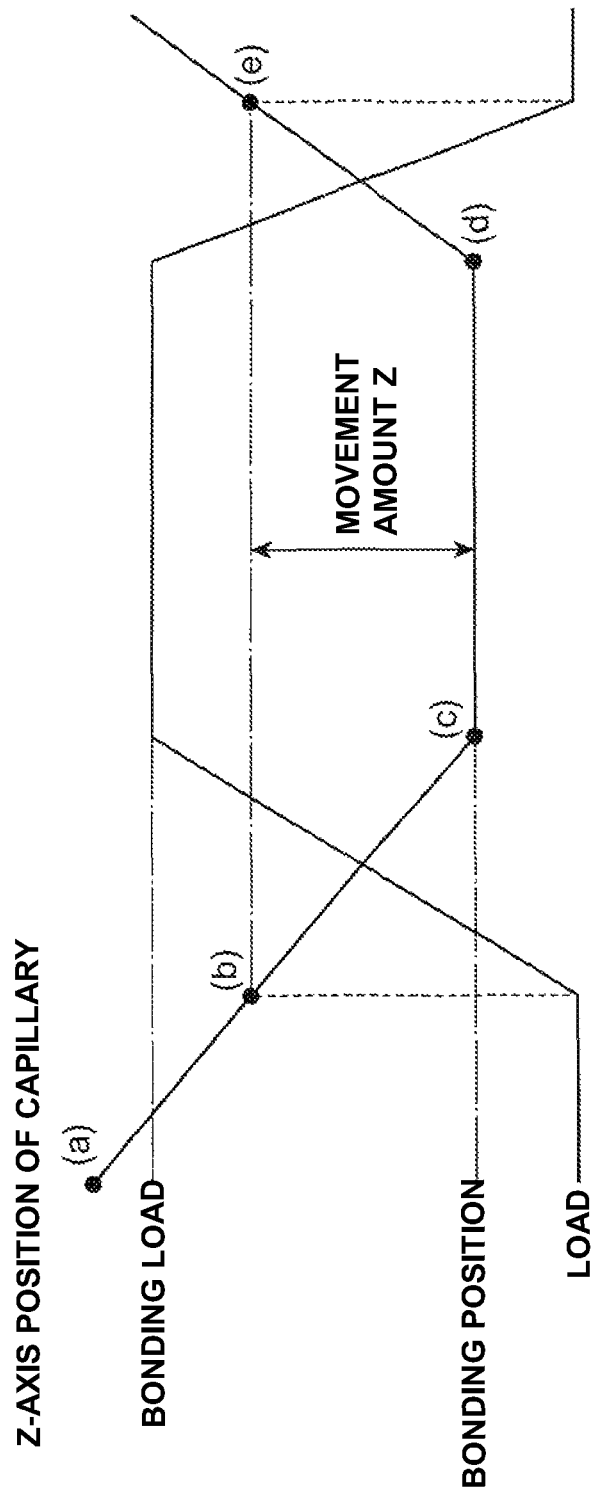
FIG. 5 is a diagram schematically illustrating relations between a position of the capillary in a Z-axis and a load detected by a load sensor.
Figure 6:
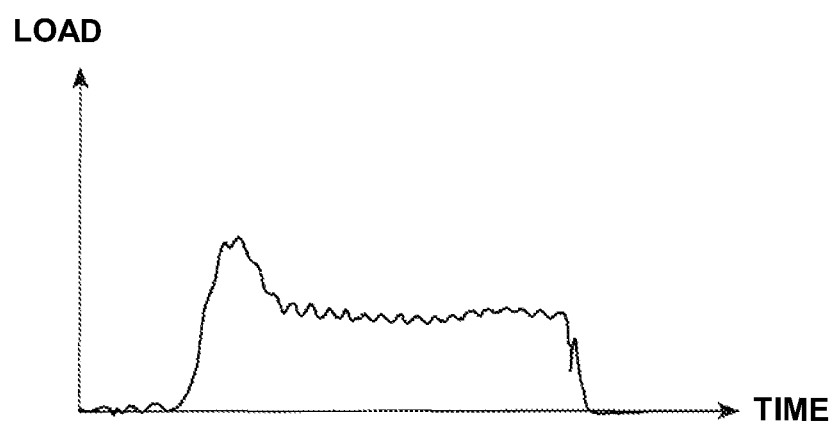
FIG. 6(a) and FIG. 6(b) are charts of observed values of the load detected by the load sensor and a load acting on the overhanging die.
Figure 6:
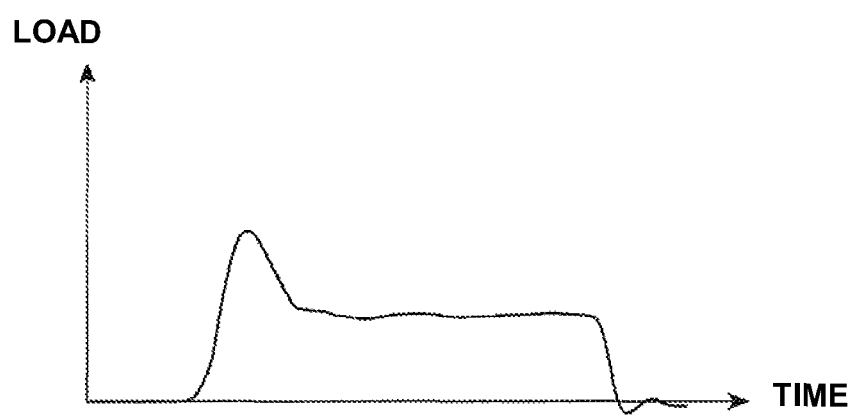

The following describes the calculation of the movement amount (distance) Z in detail with reference to FIG. 5. FIG. 5 is a diagram schematically illustrating relations between the Z-axis position of the capillary and the load detected by the load sensor. It should be noted that FIG. 4(*a*) to FIG. 4(*e*) illustrate the relations between the capillary 5 and the overhanging die 100 at points (a) to (e) shown in FIG. 5, respectively. Referring to FIG. 5, as the initial ball 10 is brought into contact with the pad 104 when the capillary 5 moved down from the point (a) to the point (b), the load detected by the load sensor 7 starts increasing from the point (b). Then, when the capillary 5 further moves down to the point (c) and reaches the bonding position, the capillary 5 stops moving, and the load detected by the load sensor 7 also stops increasing. Accordingly, when the capillary 5 is positioned at the load changing position, the initial ball 10 is brought into contact with the pad 104.

Therefore, in Step S4, the load acting on the capillary 5 and the position of the capillary 5 that have been stored in Step S1 are first referred and the load change point is detected, and whereby the load changing position of the capillary 5 at the load change point is obtained. Then, the movement amount (distance) Z of the capillary 5 from the load changing position to the bonding position is calculated by subtracting the bonding position from the load changing position.

FIG. 6(a) and FIG. 6(b) are charts of observed values of the load detected by the load sensor and the load acting on the overhanging die. FIG. 6(a) shows the load detected by the load sensor, and FIG. 6(b) shows the load acting on the overhanging die. Referring to FIG. 6(b), the load acting on the overhanging die 100 changes either in a smooth curve or in a straight line. Referring to FIG. 6(a), the load detected by the load sensor 7 changes by fluctuating in a small range. Specifically, when the drive motor 4 drives to swing the bonding arm 3 and move the capillary 5 down, the arm tip-end section 12 vibrates due to such as natural vibration of the ultrasonic horn 6. Then, as the vibration of the arm tip-end section 12 is not sufficiently suppressed before the capillary 5 moves down and the initial ball 10 is brought into contact with the pad 104, the load detected by the load sensor 7 repeats increasing and decreasing. Here, in FIG. 6(a), the load variation when the capillary 5 is at the bonding position occurs due to the generation of the ultrasonic vibration by the ultrasonic vibrator 17.

Therefore, in Step S4, the movement amount (distance) Z is calculated by subtracting the bonding position from the load changing position of the capillary 5 at the load change point that is closest to the bonding position.

Next, the control unit 20 moves the capillary 5 upward by the movement amount (distance) Z that has been calculated in Step S3 (Step S5). Specifically, in Step S5, the load applied to the drive motor 4 is released, and the capillary 5 is moved upward by the movement amount (distance) Z. This returns the capillary 5 to the position before the overhanging die 100 has been pressed downward (see FIG. 4(e)).

Thereafter, taking the position of the capillary 5 that has been moved upward in Step S5 as the reference position of the starting point for forming a wire loop, the control unit 20 controls and drives the drive motor 4 and the bonding head 2, moves the capillary 5 along a predetermined trajectory, and forms a wire loop between the pad 104 and the lead 105 (Step S6).

As described above, according to this embodiment, when moving the capillary 5 to the bonding position, the Z-axis position of the capillary 5 and the load acting on the capillary 5 are detected and stored. Then, as the load acting on the capillary changes when the capillary is brought into contact with the overhanging die, the movement amount (distance) Z of the capillary 5 from the capillary 5 is brought into contact with the overhanging die 100 until the capillary 5 reaches the bonding position is calculated by subtracting the bonding position from the load changing position of the capillary 5 at the load change point, based on the Z-axis position of the capillary 5 and the load acting on the capillary 5 that have been stored. Further, by moving the capillary 5 upward by the movement amount (distance) Z to form a wire loop after bonding the initial ball 10 to the pad 104, it is possible to make the reference positions of the starting points for forming wire loops even. Therefore, the capillary 5 is not required to stop the downward movement when the capillary 5 is brought into contact with the overhanging die 100, and it is possible to form even loops at high speed.

Moreover, as the load acting on the capillary 5 changes also by vibration of the arm tip-end section 12, the ultrasonic horn 6, the capillary 5, and the like before the capillary 5 is brought into contact with the overhanging die 100, it is difficult to determine whether the change in the load is caused by the contact between the capillary 5 and the overhanging die 100, or by the vibration of the arm tip-end section 12 and such. Therefore, by taking the load change point that is closest to the bonding position as the load change point for calculating the movement amount (distance) Z, it is possible to eliminate an influence of the vibration of the arm tip-end section 12 and such that generates before the capillary 5 is brought into contact with the overhanging die 100. Thus, it is possible to calculate the movement amount (distance) Z even more accurately.

Further, according to this embodiment, the arm base-end section 11 and the arm tip-end section 12 of the bonding arm 3 are connected by the connecting section 13 having flexibility. Accordingly, the arm tip-end section 12 flexes with respect to the arm base-end section 11 when the load acts on the capillary 5. Then, as the load sensor 7 is disposed between the arm base-end section 11 and the arm tip-end section 12, it is possible to appropriately detect the load acting on the capillary 5, based on the flexure of the arm tip-end section 12 with respect to the arm base-end section 11.

As described above, the exemplary embodiment according to the present invention has been described, but the present invention is not limited to this embodiment. According to this embodiment, the movement amount (distance) Z is calculated in Step S4 after carrying out the bonding in Step S3. However, the order of Step S3 and Step S4 is exchangeable.

Further, according to this embodiment, the load sensor 7 is provided in the slit 14a on the side of the top surface 3a of the bonding head 2. However, it is possible to provide the load sensor 7 in the slit 14b on the side of the bottom surface 3b of the bonding head 2. In this case, the sign of the load detected by the load sensor 7 is inverted from that of the load detected according to this embodiment.

Moreover, according to this embodiment, the capillary 5 is moved upward by releasing the load applied to the drive motor 4 after bonding the initial ball 10 to the pad 104. However, it is possible to move the capillary 5 upward by applying an inverted load to the drive motor 4, for example.

The present invention is not limited to the embodiment described above, and includes any alterations and modifications without departing from the technical scope and the spirit of the present invention as claimed in the appended claims.

INDUSTRIAL APPLICABILITY

The present invention can be applied to a bonding apparatus capable of bonding a wire inserted through a capillary to a pad disposed on a free end of an overhanging die.

REFERENCE NUMERALS

1 Bonding Apparatus
2 Bonding Head
3 Bonding Arm
3a Top Surface
3b Bottom Surface
4 Drive Motor
5 Capillary
6 Ultrasonic Horn
7 Load Sensor
9 Bonding Stage
10 Initial Ball
11 Arm Base-End Portion
12 Arm Tip-End Portion
13 Connecting Portion
14a Slit
14b Slit
16 Recessed Portion
17 Ultrasonic Vibrator
20 Control Unit 21 Z-Axis Motor I/F
22 Load Sensor I/F
23 Ultrasonic Vibrator I/F
24 Output Unit
25 Input Unit
26 CPU
27 Memory
271 Bonding Control Program (Bonding Control Means)
272 Load Change Detecting Program (Load Change Detecting Means)
100 Overhanging Die
101 Lower Die
102 Spacer
103 Substrate
104 Pad
105 Lead
Z Movement Amount

The invention claimed is:

1. A bonding apparatus for performing bonding operation to a pad disposed on a free end of an overhanging die, the bonding apparatus comprising:
a capillary having a wire inserted therethrough;
an ultrasonic vibrator configured to apply an ultrasonic wave to a bonding target through the capillary;
an ultrasonic horn for holding the capillary at one end and having the ultrasonic vibrator at the other end, and configured to transmit the ultrasonic wave to the capillary;
a load detector configured to detect a load acting on the capillary;
a control unit configured to control the bonding apparatus as a whole; wherein
the control unit comprises a computer program, the computer program controlling a bonding control process and a load change detecting process, the bonding control process that moves the capillary to a predetermined bonding position to bond the wire to the pad and that forms a wire loop by moving the capillary along a predetermined trajectory, the load change detecting process that stores a position of the capillary and the load acting on the capillary that has been detected by the load detector in association with each other to a memory in the control unit when moving the capillary, and wherein the bonding control process that forms the wire loop by obtaining a load change point that is a point at which the load acting on the capillary changes, based on the position of the capillary and the load acting on the capillary that have been stored by the load change detecting process that calculates a movement distance of the capillary by calculating a difference between a position of the capillary at the load change point and the bonding position and that retracts the capillary by the calculated movement distance, and that moves the capillary along the predetermined trajectory.

2. The bonding apparatus according to claim 1, further comprising:
a bonding arm swingably provided and configured to hold the ultrasonic horn, wherein the bonding arm is configured to comprise:
an arm base-end portion provided with a drive unit for swinging the bonding arm;
an arm tip-end portion disposed on a tip-end side of the arm base-end portion and configured to hold the ultrasonic horn;
a connecting portion having flexibility and configured to connect the arm base-end portion and the arm tip-end portion; and
the load detector that is disposed between the arm tip-end portion and the arm base-end portion.

3. The bonding apparatus according to claim 1,
wherein the control unit detects the position of the capillary in the Z direction every predetermined period of time, as well as the load detected by the load detector,
wherein the control unit stores the Z-axis position of the capillary and the load detected by the load detector in association with each other,
wherein the control unit refers to the Z-axis position of the capillary the load detected by the load detector that have been stored in the control unit, and
wherein the control unit calculates the movement distance Z of the capillary from the load changing position to the bonding position.

* * * * *